(12) United States Patent
Koerwer et al.

(10) Patent No.: US 10,183,359 B2
(45) Date of Patent: Jan. 22, 2019

(54) CONDENSING POINT POSITION DETECTING METHOD

(71) Applicant: DISCO CORPORATION, Tokyo (JP)

(72) Inventors: Joel Koerwer, Tokyo (JP); Seiichi Sai, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/946,038

(22) Filed: Apr. 5, 2018

(65) Prior Publication Data

US 2018/0299786 A1      Oct. 18, 2018

(30) Foreign Application Priority Data

Apr. 13, 2017   (JP) .................................. 2017-079681

(51) Int. Cl.
| | |
|---|---|
| *B23K 26/035* | (2014.01) |
| *G01B 11/14* | (2006.01) |
| *H01L 21/78* | (2006.01) |
| *H01L 21/68* | (2006.01) |
| *B23K 26/03* | (2006.01) |
| *B23K 26/06* | (2014.01) |
| *G03F 9/00* | (2006.01) |

(52) U.S. Cl.
CPC .......... *B23K 26/035* (2015.10); *B23K 26/032* (2013.01); *B23K 26/0665* (2013.01); *G01B 11/14* (2013.01); *G03F 9/7023* (2013.01); *G03F 9/7076* (2013.01); *H01L 21/681* (2013.01); *H01L 21/78* (2013.01)

(58) Field of Classification Search
CPC ....... H01L 21/68; H01L 21/681; H01L 21/78; G01B 11/14; B23K 26/03; B23K 26/032; B23K 26/035; B23K 26/0665; G03F 9/7023; G03F 9/7073; G03F 9/7076; G03F 9/708; G03F 9/7084; G03F 9/7088
USPC .................................................. 356/614–624
See application file for complete search history.

(56) References Cited

U.S. PATENT DOCUMENTS

| | | | | |
|---|---|---|---|---|
| 7,355,157 B2 * | 4/2008 | Morikazu | .......... | B23K 26/0613 250/208.1 |
| 7,428,062 B2 * | 9/2008 | Nomaru | ................ | B23K 26/03 250/201.3 |

(Continued)

FOREIGN PATENT DOCUMENTS

| | | |
|---|---|---|
| JP | 10305420 A | 11/1998 |
| JP | 2002192370 A | 7/2002 |
| JP | 2014221483 A | 11/2014 |

*Primary Examiner* — Gordon J Stock, Jr.
(74) *Attorney, Agent, or Firm* — Greer Burns & Crain Ltd.

(57) ABSTRACT

There is provided a condensing point position detecting method of detecting a position in an optical axis direction of a condensing point of a laser beam condensed by a condenser of a laser processing apparatus. The condensing point position detecting method includes: an irradiation mark forming step of forming a plurality of irradiation marks in a substrate by irradiating the substrate held by a chuck table with the laser beam while moving the condenser in the optical axis direction with respect to the substrate; and a condensing point position detecting step of detecting an irradiation mark having a proper shape from the plurality of irradiation marks formed in the substrate, and detecting the position of the condensing point forming the proper irradiation mark as a position of an accurate condensing point.

4 Claims, 5 Drawing Sheets

(56) References Cited

U.S. PATENT DOCUMENTS

| | | | |
|---|---|---|---|
| 7,564,570 B2* | 7/2009 | Sawabe | G01B 11/0608 356/614 |
| 7,846,152 B2* | 12/2010 | Chernyak | A61F 9/008 606/10 |
| 8,124,909 B2* | 2/2012 | Sawabe | B23K 26/046 219/121.67 |
| 8,378,257 B2* | 2/2013 | Nomaru | B23K 26/032 219/121.67 |
| 8,431,861 B2* | 4/2013 | Sawabe | B23K 26/03 219/121.83 |
| 9,536,787 B2* | 1/2017 | Ogawa | H01L 21/78 |
| 9,724,783 B2* | 8/2017 | Odagiri | B23K 26/0626 |
| 9,789,567 B2* | 10/2017 | Asano | B23K 26/705 |
| 2005/0155954 A1* | 7/2005 | Oba | B28D 5/023 219/121.67 |
| 2010/0084386 A1* | 4/2010 | Masuda | B23K 26/066 219/121.67 |
| 2018/0021887 A1* | 1/2018 | Liu | B23K 26/0648 219/121.75 |

\* cited by examiner

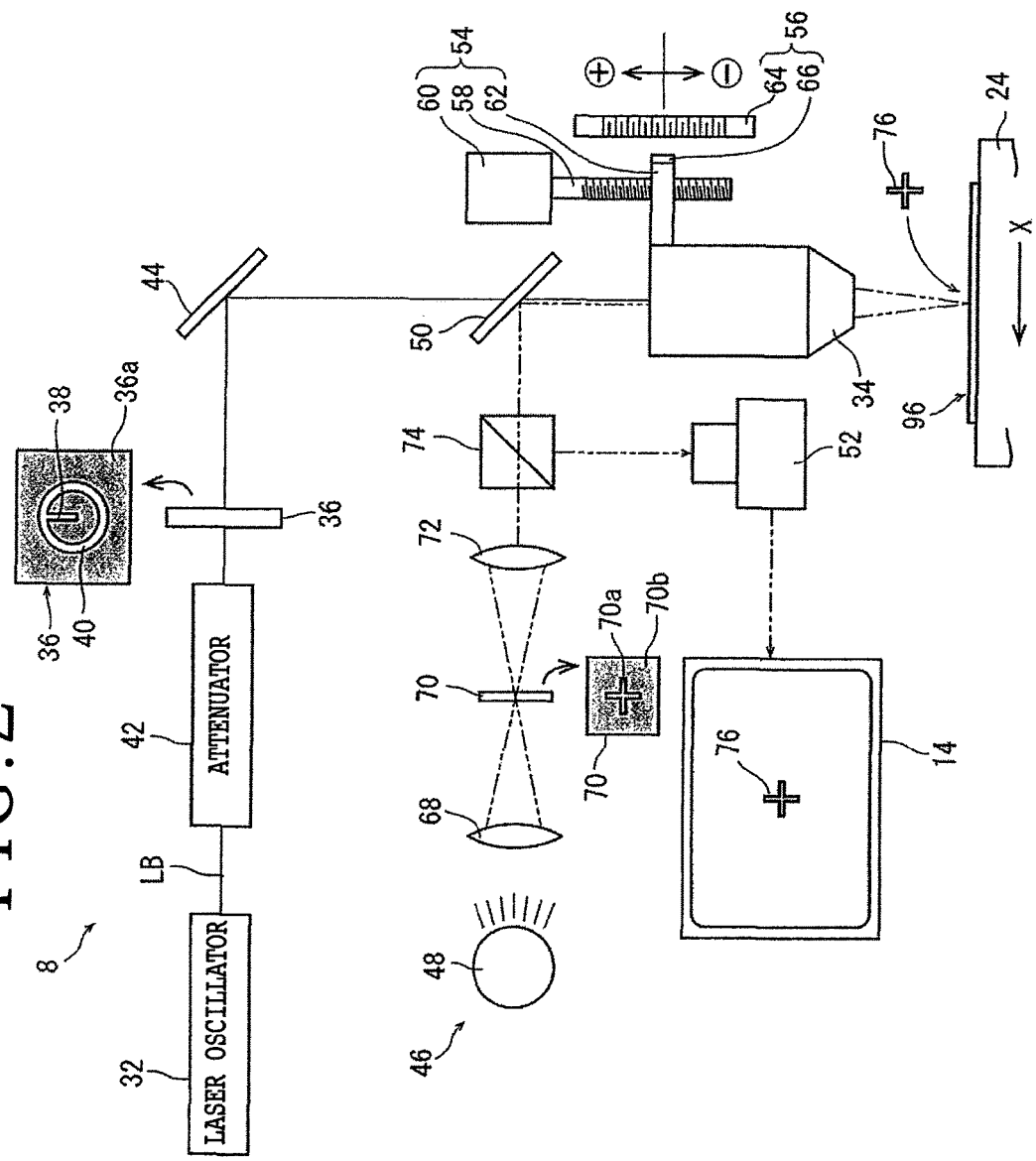

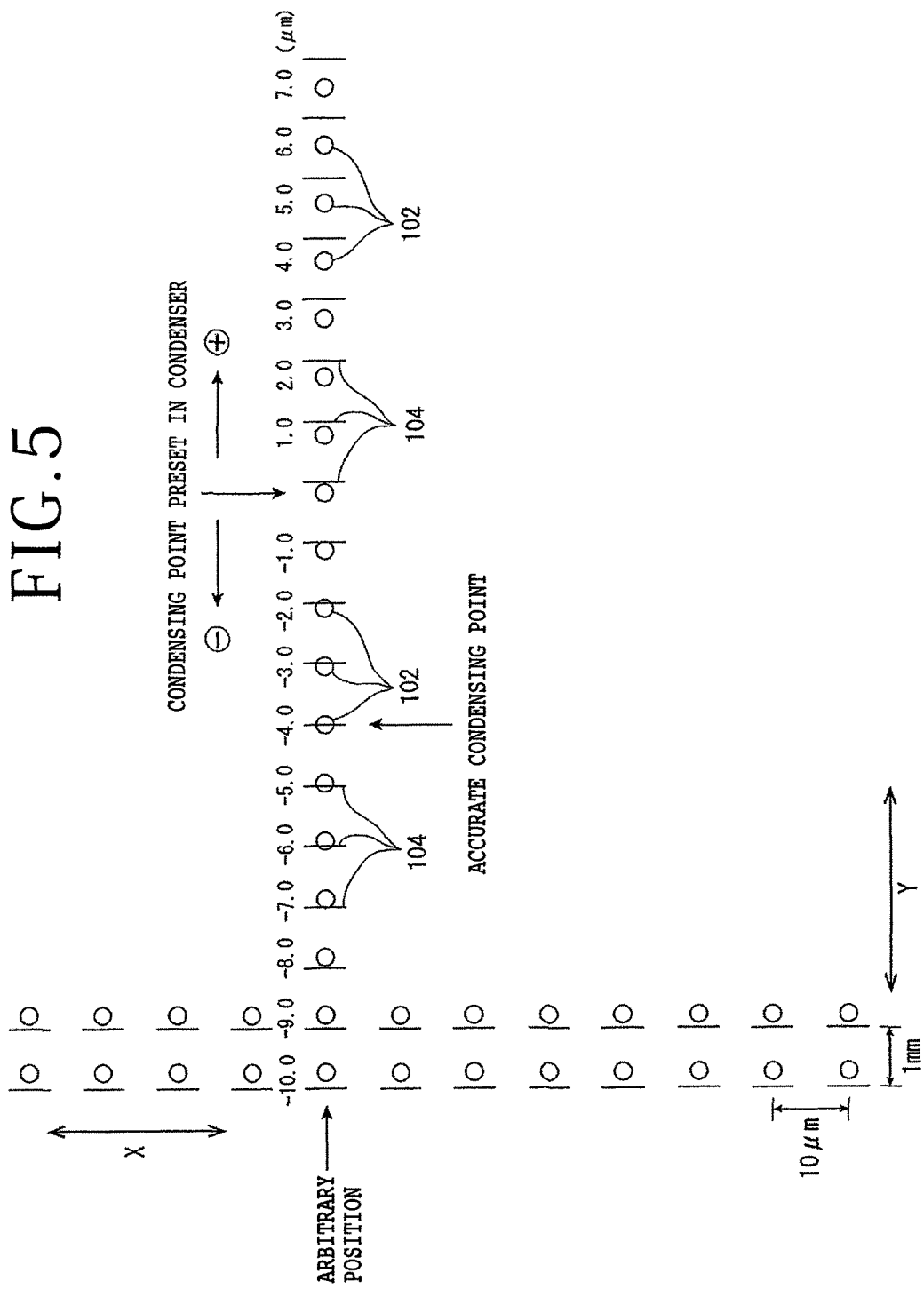

CONDENSING POINT POSITION DETECTING METHOD

BACKGROUND OF THE INVENTION

Field of the Invention

The present invention relates to a method of detecting the position of a condensing point of a laser beam.

Description of the Related Art

A wafer on which a plurality of devices such as integrated circuits (ICs), large scale integrations (LSIs), or the like are demarcated by planned dividing lines is divided into individual device chips by a laser processing apparatus. The device chips are used in electric apparatuses such as a mobile telephone, a personal computer, a communication apparatus, and the like. As the laser processing apparatus, there is a laser processing apparatus which includes holding means for holding a wafer and irradiates the wafer with a laser beam while the condensing point of the laser beam having a wavelength capable of passing through the wafer held by the holding means is positioned inside a planned dividing line, and a modified layer as a starting point of division is formed along the planned dividing line, so that the wafer can be divided into individual device chips (see Japanese Patent No. 3408805, for example).

There is also a laser processing apparatus that positions a laser beam having a wavelength absorbable by a wafer at a planned dividing line and irradiates the planned dividing line with the laser beam, and thus forms a dividing groove along the planned dividing line by ablation (see Japanese Patent Laid-open No. 1998-305420, for example).

Further, there is a laser processing apparatus that positions a laser beam having a wavelength capable of passing through a wafer at a planned dividing line and irradiates the planned dividing line with the laser beam, and thus forms, along the planned dividing line, a plurality of shield tunnels constituted of a plurality of fine holes extending from a top surface to an undersurface and an amorphous substance surrounding each fine hole (see Japanese Patent Laid-open No. 2014-221483, for example).

SUMMARY OF THE INVENTION

The laser processing apparatus that forms a modified layer as a starting point of division along a planned dividing line, in particular, has problems as follows.

(1) The condensing point condensed by a condenser needs to be properly positioned inside the wafer. The position of the condensing point condensed by the condenser is adjusted so as to coincide with a position at which a reticle is projected on the upper surface of the wafer after being guided coaxially with the optical axis of the condenser. It is assumed that the position of the condensing point condensed by the condenser is positioned at the upper surface of the wafer when the reticle is clearly projected on the upper surface of the wafer. However, there is actually an error of approximately a few μm between the projection position of the reticle and the position of the condensing point condensed by the condenser.

(2) In order to adjust the above-described error, a modified layer is formed inside a dummy wafer by positioning the condensing point of the condenser inside the wafer with the reticle as a reference, and applying a laser beam. The modified layer is thereafter exposed by dividing a region in which the modified layer is formed. A length from the upper surface of the wafer to the modified layer is actually measured. The error of the position of the condensing point when the reticle is set as the reference is thereby detected, and set as a correction value. However, the actual measurement takes a considerable time, thus resulting in poor productivity. The above-described problem can occur also in the laser processing apparatus that forms a dividing groove by ablation and the laser processing apparatus that forms a shield tunnel.

Accordingly, it is an object of the present invention to provide a condensing point position detecting method that can detect the position in an optical axis direction of the condensing point of a condenser accurately and easily.

In accordance with an aspect of the present invention, there is provided a condensing point position detecting method of detecting a position in an optical axis direction of a condensing point of a laser beam condensed by a condenser of a laser processing apparatus, the condensing point position detecting method including: a mask preparing step of preparing a mask including a slit portion extending in a radial direction of the laser beam oscillated by a laser oscillator and diffracting a part of the laser beam and a condensing point forming portion passing a part of the laser beam forming the condensing point; a substrate preparing step of preparing a substrate in which an irradiation mark is to be formed in a region to be irradiated with the laser beam; a substrate holding step of making a chuck table hold the substrate; an irradiation mark forming step of forming a plurality of irradiation marks in the substrate by irradiating the substrate held by the chuck table with the laser beam while moving the condenser in the optical axis direction with respect to the substrate; and a condensing point position detecting step of detecting an irradiation mark having a proper shape from the plurality of irradiation marks formed in the substrate, and detecting the position of the condensing point forming the proper irradiation mark as a position of an accurate condensing point, in which in the irradiation mark forming step, when the laser beam is applied while a condensing point preset in the condenser is positioned at an upper surface of the substrate, a part of the laser beam, the part reaching the slit portion formed in the mask, semicylindrically diffracts with the slit portion as an axis, is condensed by the condenser in a longitudinal direction of the slit portion and is not condensed by the condenser in a lateral direction of the slit portion, and forms a linear irradiation mark orthogonal to the slit portion, and a part of the laser beam, the part reaching the condensing point forming portion formed in the mask, is condensed by the condenser and forms a circular irradiation mark, and when a plurality of irradiation marks are formed by moving the condenser in a positive optical axis direction and a negative optical axis direction from the condensing point preset in the condenser, the plurality of irradiation marks are formed such that the linear irradiation mark moves in a manner of frame-by-frame advance from one edge to another edge of the circular irradiation mark, and in the condensing point position detecting step, an irradiation mark in which the linear irradiation mark divides the circular irradiation mark into two equal parts is detected as the irradiation mark having the proper shape.

Preferably, the laser processing apparatus includes condenser positioning means for projecting a reticle indicating the position of the condensing point preset in the condenser onto an upper surface of a workpiece held by the holding means, and positioning the condensing point preset in the condenser at the upper surface of the workpiece, and in the condensing point position detecting step, a difference between the detected position of the accurate condensing point of the condenser and the indicated position of the condensing point indicated by the reticle, is obtained and set as a correction value. Preferably, the substrate prepared in the substrate preparing step is a tin film plate formed by coating an upper surface of a plate with a tin film or a two-layer plate formed by coating an upper surface of a plate with a titanium film and further coating an upper surface of the titanium film with a tin film. Preferably, a pitch at which the condenser is moved in the optical axis direction in the irradiation mark forming step is 0.5 to 1.0 µm.

According to the present invention, the position in the optical axis direction of the condensing point of the laser beam condensed by the condenser of the laser processing apparatus can be detected accurately and easily.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 2 is a block diagram of laser beam irradiating means of the laser processing apparatus shown in FIG. 1;

FIG. 5 is a schematic diagram of a plurality of circular irradiation marks and a plurality of linear irradiation marks formed in a substrate.

DETAILED DESCRIPTION OF THE PREFERRED EMBODIMENT

Figure 1:
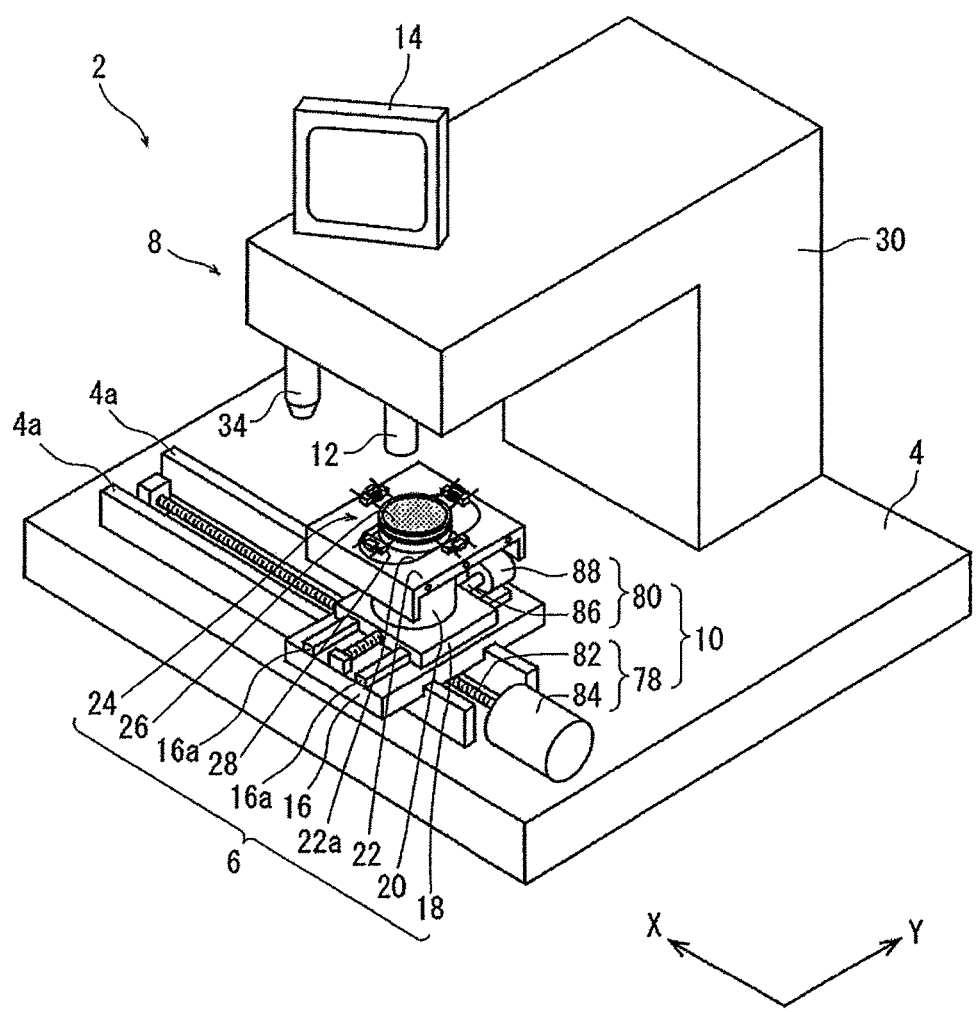
FIG. 1 is a perspective view of a laser processing apparatus.

An embodiment of a condensing point position detecting method according to the present invention will hereinafter be described with reference to the drawings. A laser processing apparatus 2 shown in FIG. 1 includes: a base 4; holding means 6 for holding a workpiece; laser irradiating means 8 for irradiating the workpiece held by the holding means 6 with a laser beam; feeding means 10 for moving the holding means 6 and the laser irradiating means 8 relative to each other; imaging means 12 for imaging the workpiece held by the holding means 6; and display means 14 for displaying an image imaged by the imaging means 12 and the like.

As shown in FIG. 1, the holding means 6 includes: a rectangular X-direction movable plate 16 mounted on the base 4 so as to be movable in an X-direction; a rectangular Y-direction movable plate 18 mounted on the X-direction movable plate 16 so as to be movable in a Y-direction; a cylindrical column 20 fixed to an upper surface of the Y-direction movable plate 18; and a rectangular cover plate 22 fixed to an upper end of the column 20. An elongated hole 22a extending in the Y-direction is formed in the cover plate 22. A circular chuck table 24 extending upward through the elongated hole 22a is rotatably mounted on the upper end of the column 20. A circular suction chuck 26 that is formed of a porous material and extends substantially horizontally is disposed on an upper surface of the chuck table 24. The suction chuck 26 is connected to suction means (not shown) by a flow passage. The chuck table 24 can suck and hold the workpiece mounted on an upper surface of the suction chuck 26 by generating a suction force in the upper surface of the suction chuck 26 by the suction means. In addition, a plurality of clamps 28 are arranged at intervals in a circumferential direction around the periphery of the chuck table 24. Incidentally, the X-direction is a direction indicated by an arrow X in FIG. 1, and the Y-direction is a direction indicated by an arrow Y in FIG. 1 and orthogonal to the X-direction. A plane defined by the X-direction and the Y-direction is substantially horizontal.

Description will be made with reference to FIG. 1 and FIG. 2. The laser irradiating means 8 includes: a frame body 30 (see FIG. 1) extending upward from an upper surface of the base 4 and then extending substantially horizontally; a laser oscillator 32 (see FIG. 2) included in the frame body 30; a condenser 34 (see FIG. 1 and FIG. 2) fitted to a lower surface of an end of the frame body 30; and a mask 36 (see FIG. 2) disposed in an optical path between the laser oscillator 32 and the condenser 34. The laser oscillator 32 is configured to oscillate a pulsed laser beam LB of a predetermined wavelength (for example, 1342 nm). The condenser 34 has a condensing lens (not shown) for condensing the pulsed laser beam LB oscillated by the laser oscillator 32 and irradiating the workpiece held by the chuck table 24 of the holding means 6 with the pulsed laser beam LB. The mask 36, which can be formed of a rectangular glass substrate, is detachably fitted in the frame body 30. In the present embodiment, as shown in a front view of the mask 36 in a direction of an optical axis of the mask 36 in FIG. 2, the mask 36 includes: a slit portion 38 that extends in a radial direction of the pulsed laser beam LB oscillated by the laser oscillator 32 and diffracts a part of the pulsed laser beam LB; and an annular condensing point forming portion 40 that passes a part of the pulsed laser beam LB forming a condensing point. The slit portion 38 is coupled to an inner circumferential edge of the condensing point forming portion 40.

A part other than the slit portion 38 and the condensing point forming portion 40 in the mask 36 is covered with a light shielding film 36a that blocks the pulsed laser beam LB. The width of the slit portion 38 (length in a direction orthogonal to the radial direction of the pulsed laser beam LB) may be, for example, approximately 40 µm. The slit portion 38 in the present embodiment has a shorter length in the radial direction of the pulsed laser beam LB than the inside diameter of the condensing point forming portion 40, and is, for example, formed so as to have approximately half of the inside diameter of the condensing point forming portion 40. The inside diameter of the condensing point forming portion 40 may be approximately 3 to 4 mm. The outside diameter of the condensing point forming portion 40 may be approximately 6 mm. That is, the outside diameter of the condensing point forming portion 40 is set slightly smaller than the diameter of the pulsed laser beam LB (for example, approximately φ7 mm) oscillated by the laser oscillator 32 (passed through an attenuator 42 in the present embodiment). In addition, in the present embodiment, the attenuator 42 that adjusts the power of the pulsed laser beam LB oscillated by the laser oscillator 32 is disposed between the laser oscillator 32 and the mask 36, and a mirror 44 that reflects the pulsed laser beam LB passed through the mask 36 and guides the pulsed laser beam LB to the condenser 34 is disposed between the mask 36 and the condenser 34.

In the present embodiment, as shown in FIG. 2, the laser irradiating means 8 includes condenser positioning means 46 for projecting a reticle indicating the position of the condensing point preset in the condenser 34 onto an upper surface of the workpiece held on the chuck table 24 of the holding means 6, and positioning the condensing point preset in the condenser 34 at the upper surface of the workpiece. The condenser positioning means 46 includes: a white light source 48; a dichroic mirror 50 that reflects the light of the white light source 48 and guides the light of the white light source 48 to the condenser 34; a camera 52 that images return light formed by reflection, from the workpiece, of the light of the white light source 48 which light is applied from the condenser 34; raising and lowering means 54 for raising and lowering the condenser 34; and detecting means 56 for detecting the vertical position of the condenser 34. The dichroic mirror 50 is configured to reflect the light of the white light source 48 (which light has wavelengths of 400 to 800 nm, for example) and guide the light of the white light source 48 to the condenser 34, and transmit light having wavelengths other than the wavelengths of the light of the white light source 48. Hence, because the pulsed laser beam LB oscillated by the laser oscillator 32 is set at a wavelength (for example, 1342 nm) other than the wavelength of the light of the white light source 48, the pulsed laser beam LB passes through the dichroic mirror 50 and enters the condenser 34. The camera 52 is electrically connected to the display means 14. A signal of an image imaged by the camera 52 is output to the display means 14.

The raising and lowering means 54 includes a ball screw 58 extending in a vertical direction and a motor 60 coupled to one end portion of the ball screw 58. A nut portion 62 of the ball screw 58 is fixed to an external surface of the condenser 34. The raising and lowering means 54 converts a rotary motion of the motor 60 into a rectilinear motion by the ball screw 58, and transmits the rectilinear motion to the condenser 34, thereby raising and lowering the condenser 34 along a guide rail (not shown) extending in the vertical direction. The detecting means 56 includes a scale 64 disposed along the vertical direction and a read head 66 fitted to the nut portion 62 of the ball screw 58 of the raising and lowering means 54. The read head 66, which may be fitted to the condenser 34, outputs pulse signals of one pulse at intervals of 0.1 µm, for example. The output pulse signals are counted by a computer (not shown). The vertical position of the condenser 34 is thereby detected. Incidentally, in a case where the motor 60 of the raising and lowering means 54 is a pulse motor, the vertical position of the condenser 34 can also be detected by counting driving pulse signals output to the motor 60 of the raising and lowering means 54. In addition, in a case where the motor 60 of the raising and lowering means 54 is a servomotor, the vertical position of the condenser 34 can also be detected by counting pulse signals output by a rotary encoder (not shown) that detects the rotational speed of the motor 60 of the raising and lowering means 54.

Continuing the description of the condenser positioning means 46 with reference to FIG. 2, a condensing lens 68, a reticle 70, a collimating lens 72, and a half-silvered mirror 74 are arranged in order from the white light source 48 side between the white light source 48 and the dichroic mirror 50. The light of the white light source 48 is condensed by the condensing lens 68, and enters the reticle 70. As shown in a sectional view of the reticle 70 in FIG. 2, a cross shape portion 70a that passes the light of the white light source 48 which light is condensed by the condensing lens 68 is formed in the reticle 70 in the present embodiment, and a part of the reticle 70 other than the cross shape portion 70a is covered with a light shielding film 70b that blocks the light of the white light source 48. The light of the white light source 48 after passing through the cross shape portion 70a of the reticle 70 is converted into collimated light by the collimating lens 72, and then enters the half-silvered mirror 74. The half-silvered mirror 74 is configured to transmit half of incident light, and reflect half of the incident light and convert the optical path. Half of the light of the white light source 48 which light enters the half-silvered mirror 74 is transmitted by the half-silvered mirror 74 and guided to the dichroic mirror 50, next reflected by the dichroic mirror 50, guided to the optical path coaxial with the optical axis of the condenser 34, and made incident on the condenser 34.

When the light of the white light source 48 after entering the condenser 34 is condensed by the condenser 34 and applied to the workpiece, a pattern 76 having the same shape as the shape of the cross shape portion 70a of the reticle 70 is projected onto the workpiece because the light of the white light source 48 has passed through the cross shape portion 70a of the reticle 70. The light of the white light source 48 after being applied to the workpiece is reflected by the workpiece, passed through the condenser 34, next reflected by the dichroic mirror 50 and guided to the half-silvered mirror 74, and further reflected by the half-silvered mirror 74 and guided to the camera 52. The pattern 76 projected on the workpiece is thereby imaged by the camera 52. The pattern 76 imaged by the camera 52 is displayed by the display means 14. Then, the condenser 34 is raised or lowered as appropriate by the raising and lowering means 54. When the pattern 76 displayed by the display means 14 becomes clear (that is, when the pattern 76 is clearly projected on the upper surface of the workpiece), it means that the condensing point preset in the condenser 34 is positioned at the upper surface of the workpiece. The condenser positioning means 46 can thus project the pattern 76 of the cross shape portion 70a of the reticle 70 indicating the position of the condensing point preset in the condenser 34 onto the upper surface of the workpiece held on the chuck table 24 of the holding means 6, and position the condensing point preset in the condenser 34 at the upper surface of the workpiece.

Description will be made with reference to FIG. 1. The feeding means 10 includes: processing feeding means 78 for processing-feeding the holding means 6 in the X-direction with respect to the laser irradiating means 8; indexing feeding means 80 for indexing-feeding the holding means 6 in the Y-direction with respect to the laser irradiating means 8; and rotating means (not shown) for rotating the chuck table 24 with respect to the column 20. The processing feeding means 78 has a ball screw 82 extending in the X-direction on the base 4 and a motor 84 coupled to one end portion of the ball screw 82.

A nut portion (not shown) of the ball screw 82 is fixed to the undersurface of the X-direction movable plate 16. The processing feeding means 78 converts a rotary motion of the motor 84 into a rectilinear motion by the ball screw 82, and transmits the rectilinear motion to the X-direction movable plate 16 to advance or retreat the X-direction movable plate 16 in the X-direction along guide rails 4a on the base 4. The chuck table 24 is thereby processing-fed in the X-direction with respect to the condenser 34. The indexing feeding means 80 has a ball screw 86 extending in the Y-direction on the X-direction movable plate 16 and a motor 88 coupled to one end portion of the ball screw 86. A nut portion (not shown) of the ball screw 86 is fixed to the undersurface of the Y-direction movable plate 18. The indexing feeding means 80 converts a rotary motion of the motor 88 into a rectilinear motion by the ball screw 86, and transmits the rectilinear motion to the Y-direction movable plate 18 to advance or retreat the Y-direction movable plate 18 in the Y-direction along guide rails 16a on the X-direction movable plate 16. The chuck table 24 is thereby indexing-fed in the Y-direction with respect to the condenser 34. The rotating means has a motor (not shown) included in the column 20. The rotating means rotates the chuck table 24 with respect to the column 20 about an axis extending in the vertical direction.

The imaging means 12 for detecting a region to be processed in the workpiece and imaging an image for performing alignment between the condenser 34 of the laser irradiating means 8 and the workpiece is attached to the lower surface of the end of the frame body 30 so as to be spaced from the condenser 34 in the X-direction, as shown in FIG. 1. In addition, the display means 14 for selectively displaying the image imaged by the imaging means 12 and the image imaged by the camera 52 of the condenser positioning means 46 is mounted on an upper surface of the end of the frame body 30.

When the position in an optical axis direction of the condensing point condensed by the condenser 34 of the laser processing apparatus 2 described above is detected, a mask preparing step is first performed which prepares a mask constituted of a slit portion that extends in the radial direction of the pulsed laser beam LB oscillated by the laser oscillator 32 and diffracts a part of the pulsed laser beam LB and a condensing point forming portion that condenses a part of the pulsed laser beam LB and forms a condensing point. The mask prepared in the mask preparing step may be the mask 36 described above, or may be a spatial light phase modulator formed of a liquid crystal (LCOS-SLM manufactured by Hamamatsu Photonics K.K., for example). Then, the prepared mask is placed in the optical path of the pulsed laser beam LB between the laser oscillator 32 and the condenser 34 (between the attenuator 42 and the mirror 44 in the present embodiment).

Figure 3A:
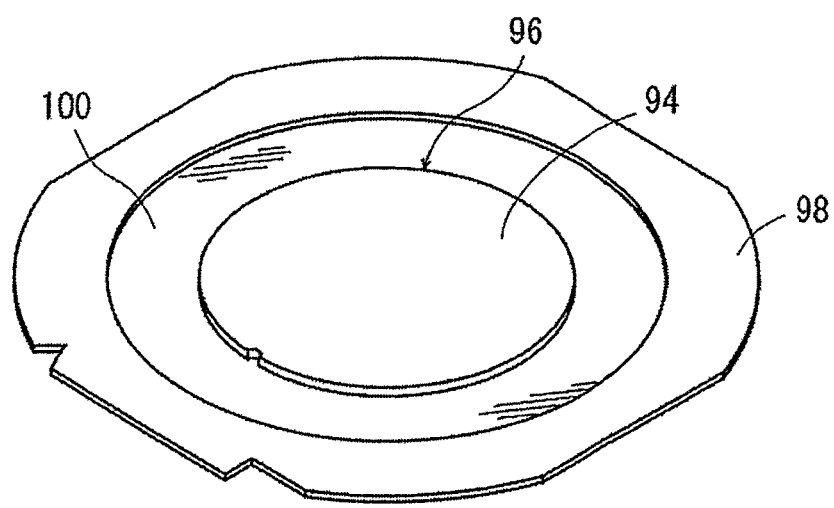
FIG. 3A is a perspective view of a wafer.
Figure 3B:
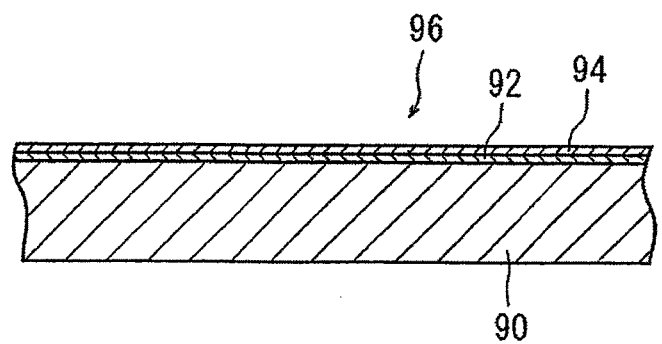
FIG. 3B is a sectional view of the wafer.

In addition, a substrate preparing step is performed which prepares a substrate in which an irradiation mark is to be formed in a region to be irradiated with the laser beam. The substrate preparing step may be performed before the mask preparing step, after the mask preparing step, or in parallel with the mask preparing step. As shown in FIG. 3A and FIG. 3B, for example, the substrate prepared in the substrate preparing step is suitably a two-layer plate 96 formed by coating an upper surface of a plate 90, which can be formed by a circular glass plate having a thickness of approximately 2 mm, with a titanium (Ti) film 92, and further coating an upper surface of the titanium film 92 with a tin (Sn) film 94. The titanium film 92 and the tin film 94 may each have a thickness of approximately 50 nm. When the tin film 94 side of the two-layer plate 96 is irradiated with a laser beam, the tin film 94 in a region irradiated with the laser beam is melted, thereby forming an irradiation mark. In addition, when the upper surface of the titanium film 92 is coated with the tin film 94, the titanium film 92 is exposed at the time of the melting of the tin film 94 and the formation of the irradiation mark by the irradiation with the laser beam, and the irradiation mark can be detected relatively easily due to a moderate contrast between the tin film 94 around the irradiation mark and the exposed titanium film 92. In the present embodiment, a lower surface of the two-layer plate 96 is affixed to an adhesive tape 100 whose circumferential edge is fixed to an annular frame 98. Incidentally, the substrate to be prepared in the substrate preparing step may be a tin film plate formed by coating an upper surface of a plate, which can be formed by a circular glass plate having a thickness of approximately 2 mm, with a tin film having a thickness of approximately 50 nm.

After the substrate preparing step is performed, a substrate holding step is performed which makes the holding means 6 hold the substrate. In the substrate holding step in the present embodiment, first, the two-layer plate 96 is placed on the upper surface of the chuck table 24 with an upper surface (the tin film 94 side) of the two-layer plate 96 directed upward. Next, a suction force is produced on the upper surface of the suction chuck 26 by actuating the suction means connected to the suction chuck 26, so that the lower surface of the two-layer plate 96 is stuck to the chuck table 24. In addition, an outer circumferential edge portion of the annular frame 98 is fixed by the plurality of clamps 28. The holding means 6 is thus made to hold the two-layer plate 96.

After the substrate holding step is performed, an irradiation mark forming step is performed which forms a plurality of irradiation marks in the substrate by applying the laser beam while moving the condenser 34 in the optical axis direction with respect to the substrate held by the holding means 6. In the irradiation mark forming step, first, the two-layer plate 96 is positioned below the condenser 34 by moving the chuck table 24 by the feeding means 10. Next, the condensing point preset in the condenser 34 is positioned at the upper surface of the two-layer plate 96 by the condenser positioning means 46. Next, the condenser 34 is moved by the raising and lowering means 54 to one side in the optical axis direction by an appropriate distance from the state in which the condensing point preset in the condenser 34 is positioned at the upper surface of the two-layer plate 96. Next, irradiation mark formation processing is performed which forms a plurality of irradiation marks in the upper surface of the two-layer plate 96 at intervals in the X-direction by irradiating the two-layer plate 96 with the pulsed laser beam LB from the condenser 34 while processing-feeding the chuck table 24 in the X-direction with respect to the condenser 34 by the processing feeding means 78 at an appropriate processing feed speed.

Figure 4A:
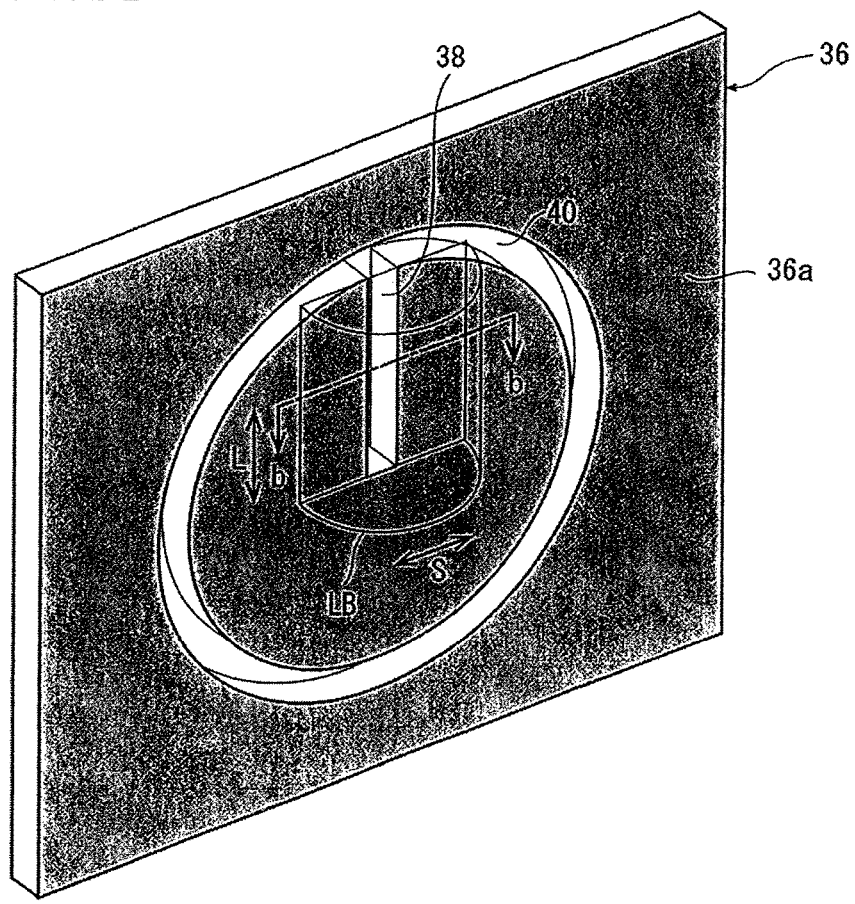
FIG. 4A is a schematic diagram showing a state in which a laser beam passed through a slit portion of a mask shown in FIG. 2 diffracts semicylindrically.
Figure 4B:
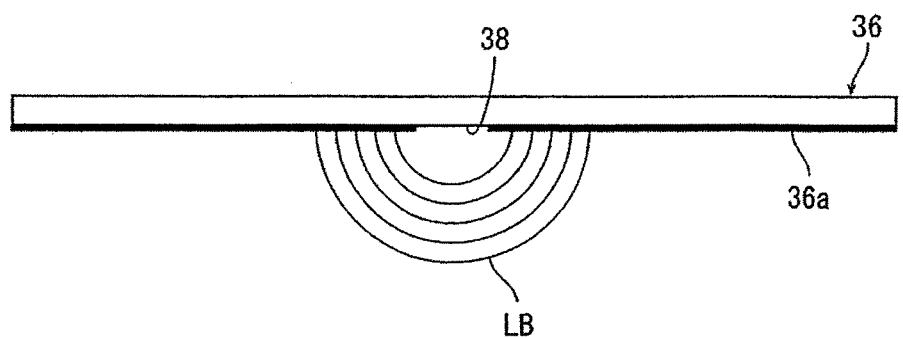
FIG. 4B is a sectional view taken along a line b-b of FIG. 4A.

The pulsed laser beam LB oscillated from the laser oscillator 32 in the irradiation mark formation processing is adjusted, by the attenuator 42, to an appropriate power at such a level as to be able to form the irradiation marks in the two-layer plate 96. The pulsed laser beam LB then passes through the mask 36, and is then reflected by the mirror 44, so that the optical path of the pulsed laser beam LB is converted. The pulsed laser beam LB then passes through the dichroic mirror 50, is thereafter condensed by the condenser 34, and is applied to the two-layer plate 96. Here, making detailed description of the pulsed laser beam LB that has passed through the mask 36, first, a part of the pulsed laser beam LB which part reached the annular condensing point forming portion 40 formed in the mask 36 is condensed by the condenser 34, and therefore forms a circular irradiation mark 102 (see FIG. 5) when applied to the two-layer plate 96. On the other hand, as shown in FIG. 4A and FIG. 4B, a part of the pulsed laser beam LB which part reached the slit portion 38 formed in the mask 36 becomes a circular wave, and diffracts semicylindrically with a longitudinal direction L of the slit portion 38 as an axis.

Therefore, the part of the pulsed laser beam LB which part passed through the slit portion 38 becomes a circular wave and diffuses in a lateral direction S of the slit portion 38, and is thus not condensed by the condenser 34 in the lateral direction S of the slit portion 38, while the part of the pulsed laser beam LB which part passed through the slit portion 38 is not affected by the slit portion 38 (does not become a circular wave and does not diffuse) in the longitudinal direction L of the slit portion 38, and is thus condensed by the condenser 34 in the longitudinal direction L of the slit portion 38. Hence, the part of the pulsed laser beam LB which part passed through the slit portion 38 forms a linear irradiation mark 104 (see FIG. 5) extending in a direction orthogonal to the longitudinal direction L of the slit portion 38 (that is, the lateral direction S of the slit portion 38) when applied to the two-layer plate 96.

After the first irradiation mark formation processing is performed in the irradiation mark forming step, the indexing feeding means 80 indexing-feeds the chuck table 24 to one side in the Y-direction with respect to the condenser 34, and the condenser 34 is moved to another side in the optical axis direction. Then, circular irradiation marks 102 and linear irradiation marks 104 under a plurality of conditions obtained by moving the condenser 34 to the other side in the optical axis direction at an appropriate pitch are formed in the upper surface of the two-layer plate 96 at intervals in the Y-direction by alternately repeating the indexing feeding to the one side in the Y-direction and the movement of the condenser 34 to the other side in the optical axis direction and the irradiation mark formation processing. The irradiation mark forming step can be performed under the following processing conditions, for example.

Wavelength of the pulsed laser beam: 1342 nm
Repetition frequency: 60 kHz
Average power: 0.1 to 0.3 W
Processing feed speed: 600 mm/second When the first irradiation mark formation processing is performed in the irradiation mark forming step, because an error of approximately a few μm can occur between the condensing point preset in the condenser 34 and an accurate condensing point condensed by the condenser 34, it suffices to move the condenser 34 to the one side in the optical axis direction by a predetermined distance (for example, 10 μm) slightly larger than the error from the state in which the condensing point preset in the condenser 34 is positioned at the upper surface of the two-layer plate 96. In addition, when the condenser 34 is moved to the other side in the optical axis direction after the first irradiation mark formation processing is performed, it suffices to move the condenser 34 by a distance (for example, 20 μm) approximately twice the predetermined distance at a pitch of 0.5 to 1.0 μm.

In the irradiation mark forming step, when a plurality of irradiation marks are formed while the condenser 34 is moved in a positive optical axis direction and a negative optical axis direction from the condensing point preset in the condenser 34, the plurality of irradiation marks are formed such that a linear irradiation mark 104 moves in a manner of frame advance from one edge to another edge of a circular irradiation mark 102. Specifically, referring to FIG. 5, description will be made of relation of the condensing point condensed by the condenser 34 to circular irradiation marks 102 and linear irradiation marks 104. FIG. 5 shows both a case where the first irradiation mark formation processing is performed after the condenser 34 is moved in the negative optical axis direction (direction indicated by "−" in FIG. 2) by 10 μm from the state in which the condensing point preset in the condenser 34 is positioned at the upper surface of the two-layer plate 96 and a case where irradiation mark formation processing is performed after the chuck table 24 is indexing-fed in the Y-direction by 1.0 mm and the condenser 34 is moved in the positive optical axis direction (direction indicated by "+" in FIG. 2) by 1.0 μm from the state in which the first irradiation mark formation processing has been performed. In addition, FIG. 5 shows that circular irradiation marks 102 and linear irradiation marks 104 are formed in the two-layer plate 96 at intervals of 10 μm in the X-direction when the chuck table 24 is moved in the X-direction at a repetition frequency of 60 kHz and a processing feed speed of 600 mm/second.

Further, FIG. 5 shows circular irradiation marks 102 and linear irradiation marks 104 as viewed along the Y-direction at an arbitrary position in the X-direction among circular irradiation marks 102 and linear irradiation marks 104 formed in the two-layer plate 96 by performing the irradiation mark formation processing while indexing-feeding the chuck table 24 in the Y-direction by 1.0 mm and moving the condenser 34 in the positive optical axis direction by 1.0 μm from the state in which the first irradiation mark formation processing has been performed. A circular irradiation mark 102 is formed in a central part of relatively high energy in the condensing point, and is not formed in a peripheral part of relatively low energy in the condensing point. Thus, the center of the circular irradiation mark 102 matches the center of the condensing point, and the diameter of the circular irradiation mark 102 is smaller than the diameter of the condensing point. However, the diameter of the circular irradiation mark 102 hardly differs between a case where the condensing point is positioned at the upper surface of the two-layer plate 96 and a case where the condensing point is positioned slightly above the upper surface of the two-layer plate 96 or slightly below the upper surface of the two-layer plate 96.

Therefore, when only circular irradiation marks 102 are formed, it is difficult to determine whether or not the condensing point is positioned at the upper surface of the two-layer plate 96.

On the other hand, a linear irradiation mark 104 passes through the slit portion 38 whose length in the radial direction of the pulsed laser beam LB is shorter than the inside diameter of the condensing point forming portion 40. Thus, when the condensing point is positioned at the upper surface of the two-layer plate 96, the linear irradiation mark 104 is formed at a position passing through the center of the circular irradiation mark 102 (that is, the center of the condensing point), whereas when the condensing point is not positioned at the upper surface of the two-layer plate 96, the linear irradiation mark 104 is formed at a position separated from the center of the circular irradiation mark 102. As the condensing point goes away from the upper surface of the two-layer plate 96, a distance between the center of the circular irradiation mark 102 and the linear irradiation mark 104 is increased. For example, as shown in FIG. 5, the vertical position of the condenser 34 when the condensing point preset in the condenser 34 is positioned at the upper surface of the two-layer plate 96 by the condenser positioning means 46 is set as a reference, and the linear irradiation mark 104 formed in the two-layer plate 96 passes through the center of the circular irradiation mark 102 when the condenser 34 is moved in the negative optical axis direction by 4 μm. Hence, the position shifted by 4 μm in the negative optical axis direction from the condensing point preset in the condenser 34 is an accurate position of the condensing point condensed by the condenser 34.

As is understood by referring to FIG. 5, when the accurate position of the condensing point condensed by the condenser 34 is positioned above the upper surface of the two-layer plate 96, the linear irradiation mark 104 is formed at a position deviating to one side (right side in FIG. 5) from the center of the circular irradiation mark 102. When the accurate position of the condensing point condensed by the condenser 34 is positioned below the upper surface of the two-layer plate 96, the linear irradiation mark 104 is formed at a position deviating to another side (left side in FIG. 5) from the center of the circular irradiation mark 102. In addition, as the condensing point goes away from the upper surface of the two-layer plate 96, the distance between the center of the circular irradiation mark 102 and the linear irradiation mark 104 is increased. When the irradiation mark forming step is thus performed, a plurality of irradiation marks are formed such that the linear irradiation mark 104 moves in a manner of frame advance from one edge to the other edge of the circular irradiation mark 102, as shown in FIG. 5.

After the irradiation mark forming step is performed, a condensing point position detecting step is performed which detects an irradiation mark having a proper shape from the plurality of irradiation marks formed in the substrate, and detects the position of the condensing point forming the proper irradiation mark as the position of an accurate condensing point. As described above, the linear irradiation mark 104 passes through the center of the circular irradiation mark 102 when the condensing point is positioned at the upper surface of the two-layer plate 96. Thus, in the condensing point position detecting step, an irradiation mark in which the linear irradiation mark 104 divides the circular irradiation mark 102 into two equal parts is detected as the irradiation mark having the proper shape. In the present embodiment, as shown in FIG. 5, the linear irradiation mark 104 divides the circular irradiation mark 102 into two equal parts at the position shifted by 4 µm in the negative optical axis direction from the condensing point preset in the condenser 34. This position is therefore detected as the position in the optical axis direction of the accurate condensing point. As described above, the present embodiment can detect the position in the optical axis direction of the condensing point condensed by the condenser 34 accurately and easily. Incidentally, when laser processing is performed using the laser processing apparatus 2, a difference (4 µm in the present embodiment) between the detected position of the accurate condensing point of the condenser 34 and the position of the condensing point which position is obtained by projecting the pattern 76 of the cross shape portion 70a of the reticle 70 onto the upper surface of the substrate is obtained and used as a correction value. Therefore, the condensing point condensed by the condenser 34 can be positioned at a proper position according to the laser processing.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A condensing point position detecting method of detecting a position in an optical axis direction of a condensing point of a laser beam condensed by a condenser of a laser processing apparatus, the condensing point position detecting method comprising:
   a mask preparing step of preparing a mask including a slit portion extending in a radial direction of the laser beam oscillated by a laser oscillator and diffracting a part of the laser beam and a condensing point forming portion passing a part of the laser beam forming the condensing point;
   a substrate preparing step of preparing a substrate in which an irradiation mark is to be formed in a region to be irradiated with the laser beam;
   a substrate holding step of making a chuck table hold the substrate;
   an irradiation mark forming step of forming a plurality of irradiation marks in the substrate by irradiating the substrate held by the chuck table with the laser beam while moving the condenser in the optical axis direction with respect to the substrate; and
   a condensing point position detecting step of detecting an irradiation mark having a proper shape from the plurality of irradiation marks formed in the substrate, and detecting the position of the condensing point forming the proper irradiation mark as a position of an accurate condensing point,
   wherein in the irradiation mark forming step,
   when the laser beam is applied while a condensing point preset in the condenser is positioned at an upper surface of the substrate, a part of the laser beam, the part reaching the slit portion formed in the mask, semicylindrically diffracts with the slit portion as an axis, is condensed by the condenser in a longitudinal direction of the slit portion and is not condensed by the condenser in a lateral direction of the slit portion, and forms a linear irradiation mark orthogonal to the slit portion, and a part of the laser beam, the part reaching the condensing point forming portion formed in the mask, is condensed by the condenser and forms a circular irradiation mark, and
   when a plurality of irradiation marks are formed by moving the condenser in a positive optical axis direction and a negative optical axis direction from the condensing point preset in the condenser, the plurality of irradiation marks are formed such that the linear irradiation mark moves in a manner of frame-by-frame advance from one edge to another edge of the circular irradiation mark, and
   in the condensing point position detecting step, an irradiation mark in which the linear irradiation mark divides the circular irradiation mark into two equal parts is detected as the irradiation mark having the proper shape.

2. The condensing point position detecting method according to claim 1, wherein
   the laser processing apparatus includes condenser positioning means for projecting a reticle indicating the position of the condensing point preset in the condenser onto an upper surface of a workpiece held by the chuck table, and positioning the condensing point preset in the condenser at the upper surface of the workpiece, and
   in the condensing point position detecting step, a difference between the detected position of the accurate condensing point of the condenser and the indicated position of the condensing point indicated by the reticle, is obtained and set as a correction value.

3. The condensing point position detecting method according to claim 1, wherein
   the substrate prepared in the substrate preparing step is a tin film plate formed by coating an upper surface of a plate with a tin film or a two-layer plate formed by coating an upper surface of a plate with a titanium film and further coating an upper surface of the titanium film with a tin film.

4. The condensing point position detecting method according to claim 1, wherein
   a pitch at which the condenser is moved in the optical axis direction in the irradiation mark forming step is 0.5 to 1.0 µm.

* * * * *